United States Patent
Ho et al.

(10) Patent No.: US 7,030,470 B1
(45) Date of Patent: Apr. 18, 2006

(54) USING CHIP LAMINATION TO COUPLE AN INTEGRATED CIRCUIT WITH A MICROSTRIP TRANSMISSION LINE

(75) Inventors: Ronald Ho, Mountain View, CA (US); Robert J. Drost, Mountain View, CA (US); Chih-Kong Ken Yang, Santa Monica, CA (US)

(73) Assignee: SUN Microsystems, Inc., Santa Clara, CA (US)

( * ) Notice: Subject to any disclaimer, the term of this patent is extended or adjusted under 35 U.S.C. 154(b) by 129 days.

(21) Appl. No.: 10/844,196

(22) Filed: May 11, 2004

(51) Int. Cl.
*H01L 39/00* (2006.01)
(52) U.S. Cl. .................. 257/662; 257/664; 257/777
(58) Field of Classification Search ............ 257/662, 257/664, 777
See application file for complete search history.

(56) References Cited

U.S. PATENT DOCUMENTS 5,932,926 A * 8/1999 Maruyama et al. ......... 257/728

6,314,013 B1 11/2001 Ahn et al. .................. 365/63

* cited by examiner

*Primary Examiner*—Thien F. Tran
(74) *Attorney, Agent, or Firm*—Park, Vaughan & Fleming, LLP

(57) ABSTRACT

One embodiment of the present invention provides a system that operatively couples an integrated circuit with a microstrip transmission line through chip lamination. The system includes a first semiconductor die containing the integrated circuit, and a second semiconductor die containing the microstrip transmission line. Unlike metal lines in the integrated circuit, which have relatively small cross-sections, the microstrip transmission line has a cross-section that is large enough so that signal propagation is governed by inductance and capacitance (LC) instead of resistance and capacitance (RC). The first semiconductor die and the second semiconductor die are laminated together so that the integrated circuit on the first semiconductor die is operatively coupled with the microstrip transmission line in the second semiconductor die.

29 Claims, 4 Drawing Sheets

104 SEMICONDUCTOR DIE WITH MICROSTRIPS

102 SEMICONDUCTOR DIE WITH ACTIVE DEVICES

USING CHIP LAMINATION TO COUPLE AN INTEGRATED CIRCUIT WITH A MICROSTRIP TRANSMISSION LINE

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

1. Field of the Invention

The present invention relates to the design of circuitry within semiconductor chips. More specifically, the present invention relates to a method and an apparatus that uses chip lamination to operatively couple an integrated circuit with a microstrip transmission line.

2. Related Art

As integration densities on semiconductor chips continue to increase, wires on the semiconductor chips have become extremely thin and squat, and hence very resistive, making them poor communication channels over long distances. Signal propagation delays for these wires are largely determined by the product of their resistance and capacitance, and are far slower than the maximum speed of electromagnetic signals through silicon dioxide. Making a wire wider (though still squat) can improve the wire's latency somewhat, but at the expense of bandwidth, since wider wires consume more space than thinner ones. Hence, the technique of widening wires to achieve latency reduction provides diminishing returns as wires become very wide.

System architects and circuit designers are beginning to view these wire performance limitations as one of the most pressing technological problems that must be overcome in order to keep increasing computer system performance. Radio-frequency circuit designers, too, find the high resistivity of on-chip wires troubling. The high loss in these wires lowers the quality factor of on-chip resonators and antennae, and increases the loss in distributed circuits, making such designs expensive and inefficient.

By contrast, transmission lines, typically on printed circuit boards (PCBs), are not very resistive. Hence, signal propagation in these transmission lines is governed by inductance and capacitance (LC) instead of resistance and capacitance (RC). Consequently, these transmission lines can propagate signals rapidly across long distances. They can also act as high-quality resonators and low-loss distributed circuits.

Although transmission lines have desirable characteristics, good transmission lines cannot be built using conventional fabrication technologies for integrated circuits. Even when on-chip wires are constructed as wide traces and are isolated from other wires, their small thickness still causes a significant resistive loss. In addition, isolating such wire traces can consume significant metal resources.

Hence, what is needed is a method and an apparatus for using transmission lines to improve the performance of an integrated circuit without the above-described problems.

SUMMARY

One embodiment of the present invention provides a system that operatively couples an integrated circuit with a microstrip transmission line through chip lamination. The system includes a first semiconductor die containing the integrated circuit, and a second semiconductor die containing the microstrip transmission line. Unlike metal lines in the integrated circuit, which have relatively small cross-sections, the microstrip transmission line has a cross-section that is large enough so that signal propagation is governed by inductance and capacitance (LC) instead of resistance and capacitance (RC). The first semiconductor die and the second semiconductor die are laminated together so that the integrated circuit on the first semiconductor die is operatively coupled with the microstrip transmission line in the second semiconductor die.

In a variation on this embodiment, the microstrip transmission line on the second semiconductor die is configured to function as a long-distance transmission line between distant nodes within the integrated circuit on the first semiconductor die.

In a variation on this embodiment, the microstrip transmission line is configured to function as a resonator.

In a variation on this embodiment, the microstrip transmission line is configured to function as an antenna.

In a variation on this embodiment, the microstrip transmission line has a cross-sectional area which is more than an order of magnitude larger than the cross-sectional area of the largest metal line in the integrated circuit.

In a variation on this embodiment, the microstrip transmission line is at least several times thicker than the thickest metal line in the integrated circuit.

In a variation on this embodiment, laminating the first semiconductor die and the second semiconductor die together involves arranging the first semiconductor die and the second semiconductor die to be: face-to-face, back-to-back, or face-to-back.

In a variation on this embodiment, laminating the first semiconductor die and the second semiconductor die together involves using edge connectors between the first semiconductor die and the second semiconductor die to operatively couple the integrated circuit with the microstrip transmission line.

In a variation on this embodiment, laminating the first semiconductor die and the second semiconductor die together involves using one or more vias through either the first semiconductor die or the second semiconductor die to operatively couple the integrated circuit with the microstrip transmission line.

In a variation on this embodiment, laminating the first semiconductor die and the second semiconductor die together involves using a capacitive coupling mechanism to operatively couple the integrated circuit with the microstrip transmission line.

In a variation on this embodiment, laminating the first semiconductor die and the second semiconductor die together involves using an optical coupling mechanism to operatively couple the integrated circuit with the microstrip transmission line.

In a variation on this embodiment, laminating the first semiconductor die and the second semiconductor die together involves establishing physical contact between at least one conductor on the first semiconductor die and at least one conductor on the second semiconductor die to operatively couple the integrated circuit with the microstrip transmission line.

In a variation on this embodiment, the second semiconductor die includes multiple layers of microstrip transmission lines, wherein adjacent layers are separated by intervening ground planes. In a further variation, the intervening ground planes include holes to allow connections between microstrips in different layers.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Microstrips

One embodiment of the present invention includes a first die with active circuitry (transistors) and a number of interconnection metallization layers above it. The wires in the metallization layers provide local interconnections between neighboring circuits. The wires are generally at the native pitch of the technology, and are hence fairly fine and therefore resistive.

On a second die (with or without active circuitry), a number of coarse metallization layers are constructed with very wide and thick wires (microstrips), and with very large spacing to neighboring wires. These wires act as lithographically-controlled transmission lines. A key property of these wires is that they are fat in cross section and therefore good transmission lines. By contrast, wires on the first die are built with aggressive transistor technologies and are hence squat in cross section and highly resistive.

Figure 1:
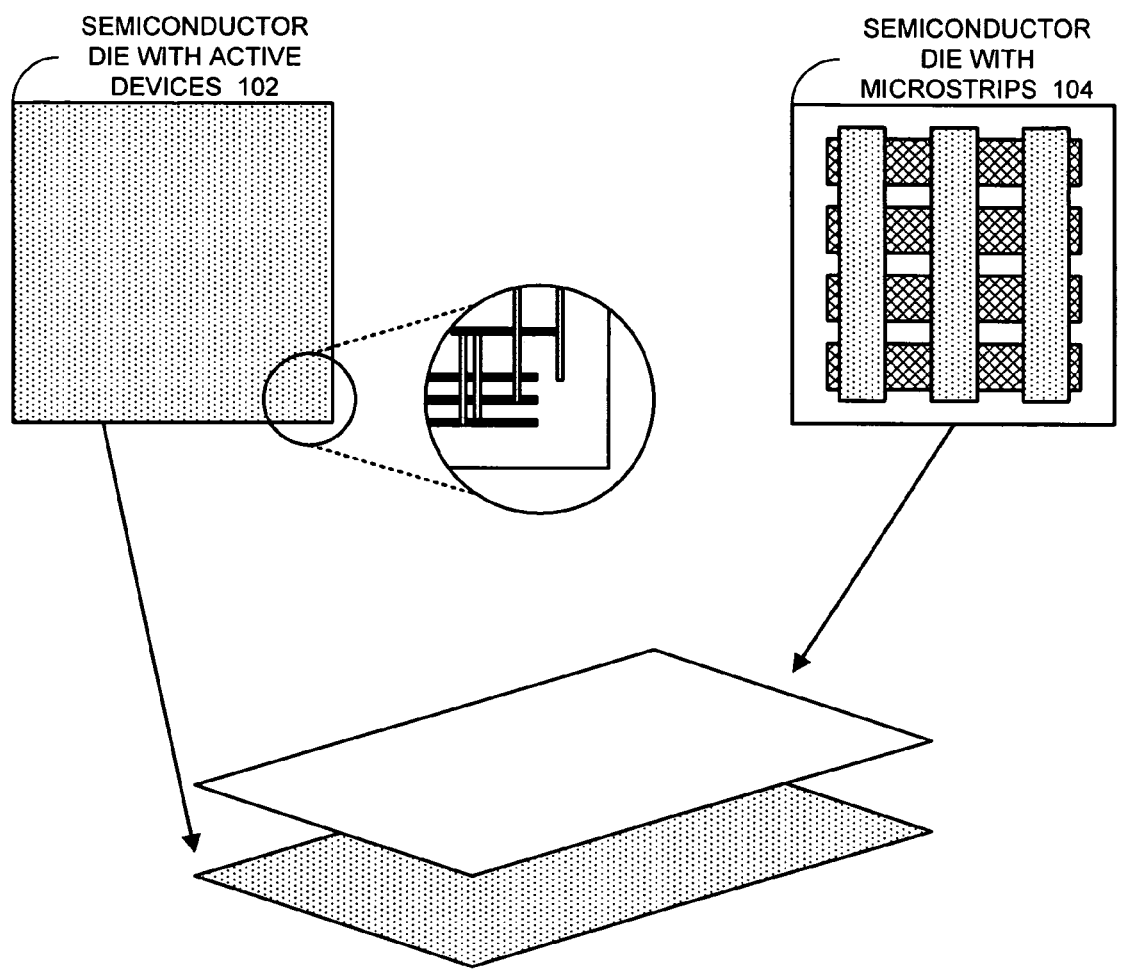
FIG. 1 illustrates a semiconductor die with active devices coupled to a semiconductor die with microstrips in accordance with an embodiment of the present invention.

This second die is then laminated to the first die, and the two dies are electrically coupled through vias or edge connectors. In this way, the first die is coupled to microstrips that function as large transmission lines on the second die. These microstrips can be used as very effective long-distance transmission lines, possibly as RF circuit elements, or possibly as distributed elements. FIG. 1 shows this lamination, although note that there can also be multiple microstrip chips as well.

Figure 2:
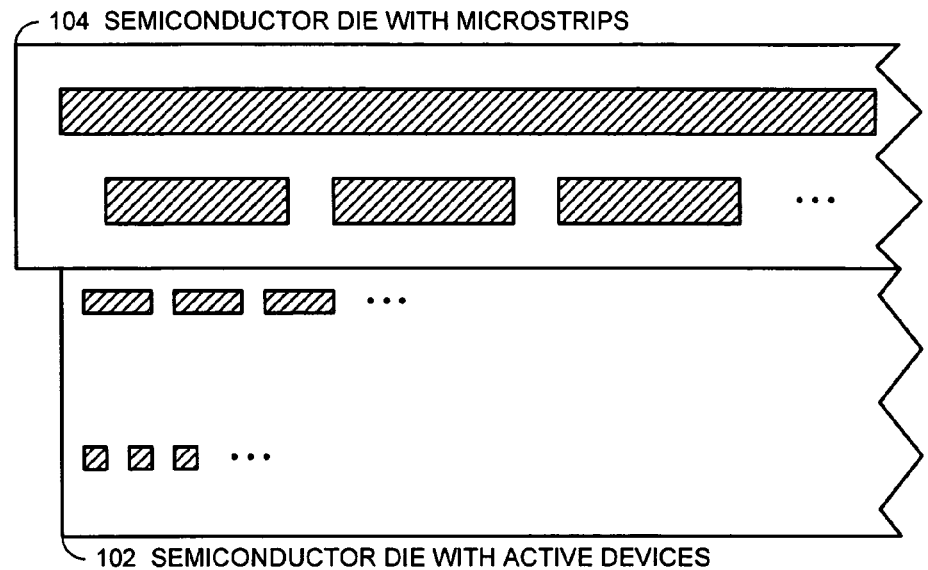
FIG. 2 presents a cross-sectional view of a semiconductor die with active devices coupled to a semiconductor die with microstrips in accordance with an embodiment of the present invention.

FIG. 2 presents a cross-sectional view of a semiconductor die 102 with active devices coupled to a semiconductor die 104 with microstrips in accordance with an embodiment of the present invention. Note that wires in the lower metal layers of semiconductor die 102 have an extremely small cross-sectional area, while wires in higher metal layers of semiconductor die 102 are wider, and hence have a larger cross-sectional area. In contrast, the microstrips in semiconductor die 104 are made with a different process and have a much larger cross-sectional area, potentially tens or hundreds of times larger than the largest wires in semiconductor die 102.

Lamination Techniques

Figure 3A:
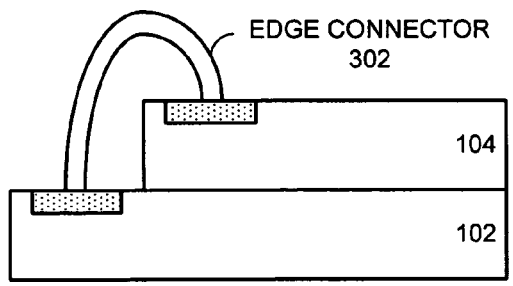
FIG. 3A illustrates using an edge connector to make a conductive connection between semiconductor dies in accordance with an embodiment of the present invention.
Figure 3B:
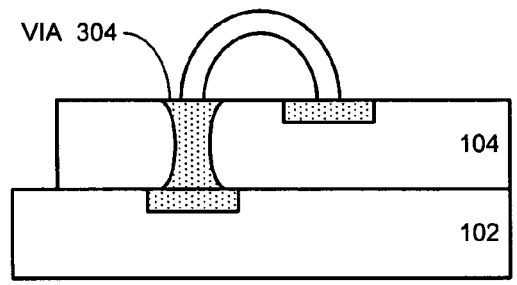
FIG. 3B illustrates using a via through a semiconductor die to achieve a conductive connection between semiconductor dies in accordance with an embodiment of the present invention.
Figure 3C:
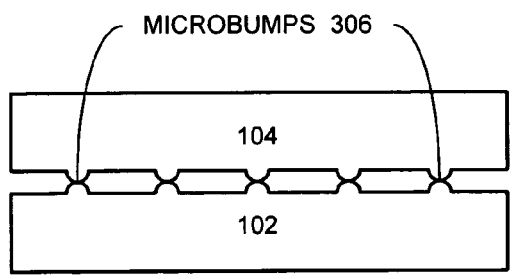
FIG. 3C illustrates making a conductive connection between semiconductor dies through microbumps in accordance with an embodiment of the present invention.
Figure 3D:
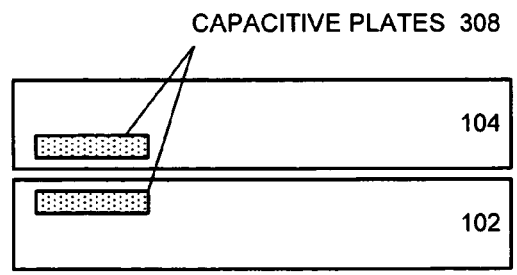
FIG. 3D illustrates making how semiconductor dies can be operatively coupled together through capacitive coupling in accordance with an embodiment of the present invention.

A number of different techniques can be used to laminate multiple chips to each other. These techniques include using a covalent oxide bond, a type of metal weld, or some other scheme to securely attach two or more chips together, face-to-face, back-to-back, or face-to-back. At the same time, conductive connections can be made between attached chips using wires over the edge of the bonded chips (see FIG. 3A) or vias through the chips (see FIG. 3B). Conductive connections can also be made by bringing microbumps on the chips into contact with each other (see FIG. 3C). It is also possible to form non-conductive capacitive (or optical) connections between chips as is illustrated in FIG. 3D. Thus, circuit designers can use these different techniques to couple together different semiconductor dies containing different circuitry and different metallization patterns.

The efficacy of the transmission lines on the second die can be evaluated by means of an attenuation constant, α. α is calculated as, $$\frac{1}{2} \frac{RC}{\sqrt{LC}},$$

or the ratio of the wire's RC to LC delays. With low-resistance (thick and wide) wires, high inductance (large loops), and low capacitance (far neighbors), the attenuation constant will approach zero, making the wire a high-quality transmission line.

Permutations

The applications of such on-chip transmission lines are diverse: fast on-chip interconnections that avoid the highly resistive native wires; high-quality resonators and antennae; and low-loss distributed elements.

If used as fast interconnections, these on-chip transmission lines can implement low-latency and narrow networks; a natural fit for many network protocols or asynchronous control structures.

Figure 5A:
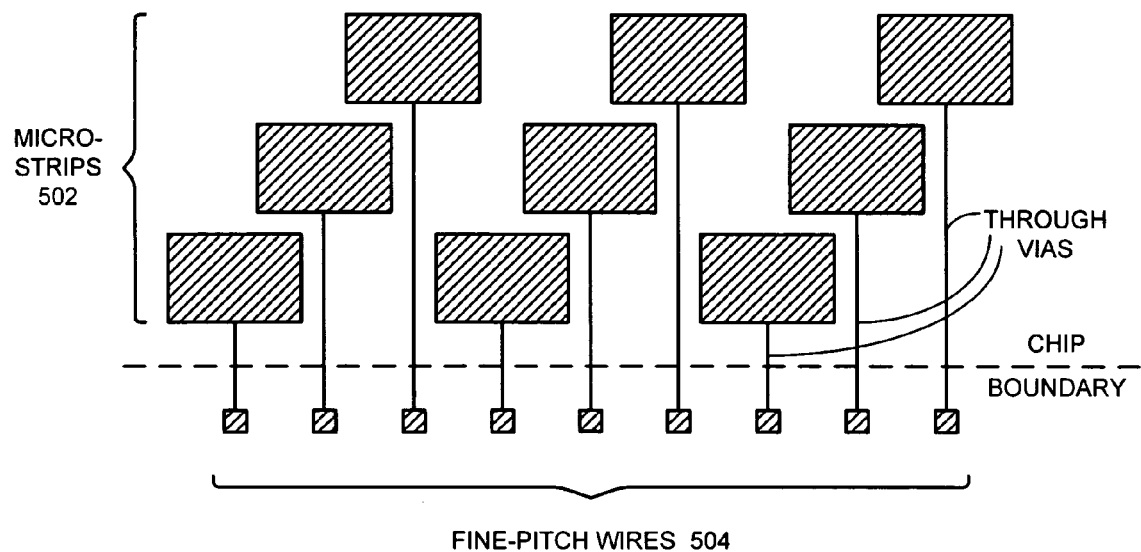
FIG. 5A illustrates how wires with different pitches can be coupled together in accordance with an embodiment of the present invention.

If used for wide buses of data, the laminated chip may require multiple layers of coarse pitch microstrips to fit in the area required and to align them with fine-pitch on-chip wires. FIG. 5A illustrates an example of three layers of wider, thicker microstrips 502 on the upper chip that can be used with fine-pitch wires 504 on the lower chip.

In a permutation on the above idea, these multiple layers may exist on different chips that are laminated together.

Figure 5B:
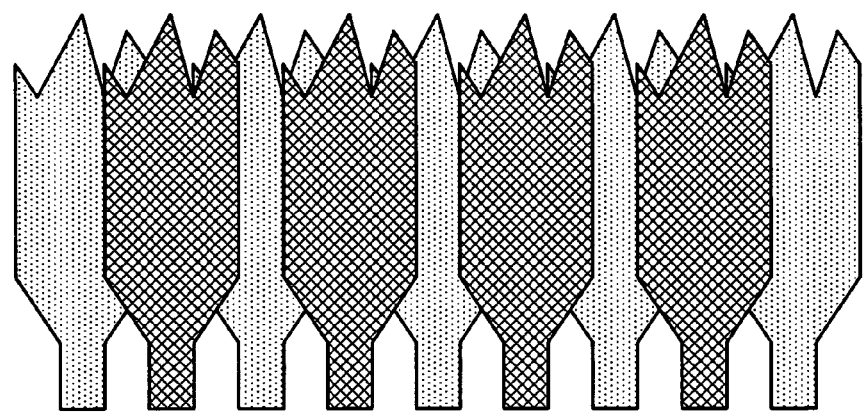
FIG. 5B illustrates how wires can be tapered to match wires with different pitches in accordance with an embodiment of the present invention.

An alternate method of attaching the coarse-pitch transmission lines to the fine-pitch wires on the base chip employs thin fingers of metal, as seen in FIG. 5B. In this figure, individual transmission lines on two layers taper down to match the finer pitch on the base chip.

If used for RF circuits, the laminated chip's transmission lines can be used for antennas, resonant circuits like inductors, and distributed elements.

Figure 4:
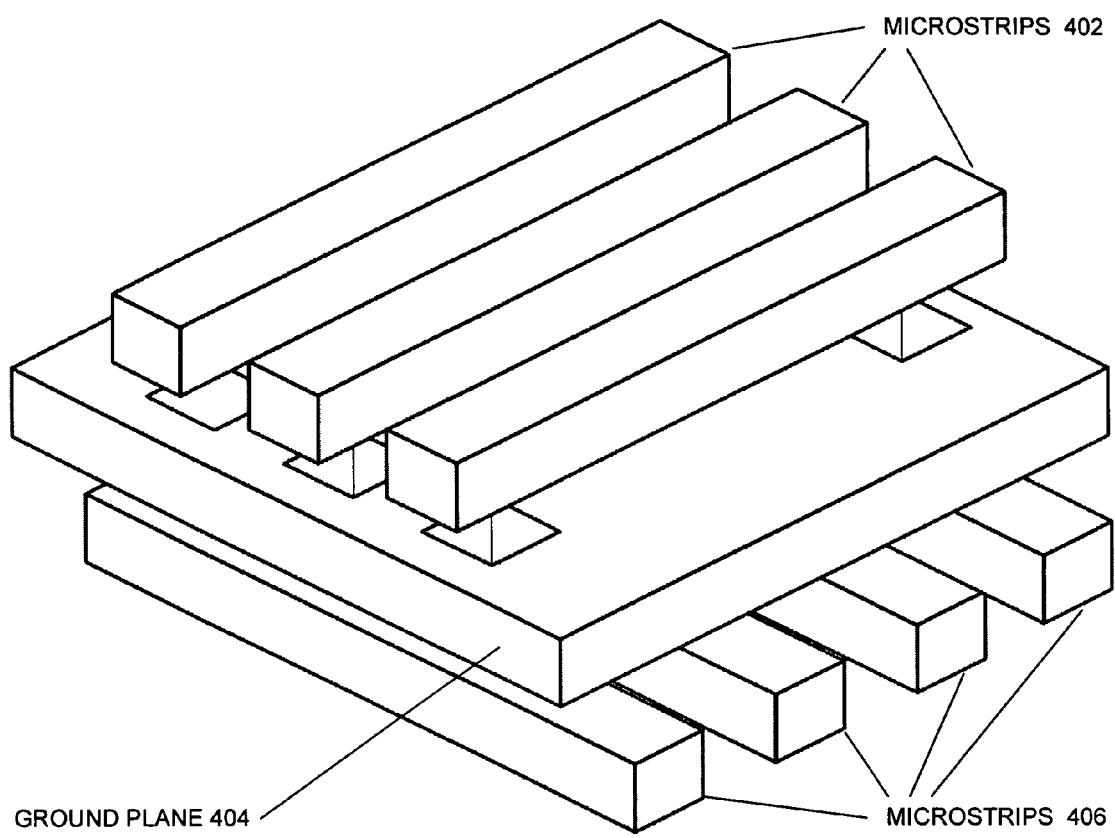
FIG. 4 illustrates a ground plane between layers of microstrips in accordance with an embodiment of the present invention.

Another permutation uses ground planes in the laminated chip to improve the characteristics of the transmission lines. FIG. 4 shows a pair of transmission-line layers separated by a ground plane. In FIG. 4, the wires run in orthogonal directions on either side of a ground plane. However, it is also possible for the wires the run in the same direction on either side of a ground plane. Furthermore, the ground plane can be perforated where appropriate to allow connections between layers. These layers can all be on a single laminated chip or on multiple laminated chips.

If the wires are paired differentially, so that each signal uses a pair of wires for communication, a ground plane offers less benefit and can be omitted. Furthermore, note that the transmission lines need not be co-linear.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus that operatively couples an integrated circuit with a microstrip transmission line through chip lamination, comprising:
    a first semiconductor die containing the integrated circuit; and
    a second semiconductor die containing the microstrip transmission line, wherein, unlike metal lines in the integrated circuit that have relatively small cross-sections, the microstrip transmission line has a cross-section that is large enough so that signal propagation is governed by inductance and capacitance (LC) instead of resistance and capacitance (RC);
    wherein the first semiconductor die and the second semiconductor die are laminated together so that the integrated circuit on the first semiconductor die is operatively coupled with the microstrip transmission line in the second semiconductor die.

2. The apparatus of claim 1, wherein the microstrip transmission line on the second semiconductor die is configured to function as a long-distance transmission line between distant nodes within the integrated circuit on the first semiconductor die.

3. The apparatus of claim 1, wherein the microstrip transmission line is configured to function as a resonator.

4. The apparatus of claim 1, wherein the microstrip transmission line is configured to function as an antenna.

5. The apparatus of claim 1, wherein the microstrip transmission line has a cross-sectional area which is more than an order of magnitude larger than the cross-sectional area of the largest metal line in the integrated circuit.

6. The apparatus of claim 1, wherein the microstrip transmission line is at least several times thicker than the thickest metal line in the integrated circuit.

7. The apparatus of claim 1, wherein laminating the first semiconductor die and the second semiconductor die together involves arranging the first semiconductor die and the second semiconductor die to be:
    face-to-face;
    back-to-back; or
    face-to-back.

8. The apparatus of claim 1, wherein laminating the first semiconductor die and the second semiconductor die together involves using edge connectors between the first semiconductor die and the second semiconductor die to operatively couple the integrated circuit with the microstrip transmission line.

9. The apparatus of claim 1, wherein laminating the first semiconductor die and the second semiconductor die together involves using one or more vias through either the first semiconductor die or the second semiconductor die to operatively couple the integrated circuit with the microstrip transmission line.

10. The apparatus of claim 1, wherein laminating the first semiconductor die and the second semiconductor die together involves using a capacitive coupling mechanism to operatively couple the integrated circuit with the microstrip transmission line.

11. The apparatus of claim 1, wherein laminating the first semiconductor die and the second semiconductor die together involves using an optical coupling mechanism to operatively couple the integrated circuit with the microstrip transmission line.

12. The apparatus of claim 1, wherein laminating the first semiconductor die and the second semiconductor die together involves establishing physical contact between at least one conductor on the first semiconductor die and at least one conductor on the second semiconductor die to operatively couple the integrated circuit with the microstrip transmission line.

13. The apparatus of claim 1,
    wherein the second semiconductor die includes multiple layers of microstrip transmission lines; and
    wherein adjacent layers are separated by intervening ground planes.

14. The apparatus of claim 13, wherein the intervening ground planes include holes to allow connections between microstrips in different layers.

15. A method for operatively coupling an integrated circuit with a microstrip transmission line through chip lamination, comprising:
    receiving a first semiconductor die containing the integrated circuit; and
    receiving a second semiconductor die containing the microstrip transmission line, wherein, unlike metal lines in the integrated circuit that have relatively small cross-sections, the microstrip transmission line has a cross-section that is large enough so that signal propagation is governed by inductance and capacitance (LC) instead of resistance and capacitance (RC); and
    laminating the first semiconductor die and the second semiconductor die together so that the integrated circuit on the first semiconductor die is operatively coupled with the microstrip transmission line in the second semiconductor die.

16. The method of claim 15, further comprising using the microstrip transmission line on the second semiconductor die as a long-distance transmission line between distant nodes within the integrated circuit on the first semiconductor die.

17. The method of claim 15, further comprising using the microstrip transmission line as a resonator.

18. The method of claim 15, further comprising using the microstrip transmission line as an antenna.

19. The method of claim 15, wherein the microstrip transmission line has a cross-sectional area which is more than an order of magnitude larger than the cross-sectional area of the largest metal line in the integrated circuit.

20. The method of claim 15, wherein the microstrip transmission line is at least several times thicker than the thickest metal line in the integrated circuit.

21. The method of claim 15, wherein laminating the first semiconductor die and the second semiconductor die together involves arranging the first semiconductor die and the second semiconductor die to be:
   face-to-face;
   back-to-back; or
   face-to-back.

22. The method of claim 15, wherein laminating the first semiconductor die and the second semiconductor die together involves using edge connectors between the first semiconductor die and the second semiconductor die to operatively couple the integrated circuit with the microstrip transmission line.

23. The method of claim 15, wherein laminating the first semiconductor die and the second semiconductor die together involves using one or more vias through either the first semiconductor die or the second semiconductor die to operatively couple the integrated circuit with the microstrip transmission line.

24. The method of claim 15, wherein laminating the first semiconductor die and the second semiconductor die together involves using a capacitive coupling mechanism to operatively couple the integrated circuit with the microstrip transmission line.

25. The method of claim 15, wherein laminating the first semiconductor die and the second semiconductor die together involves using an optical coupling mechanism to operatively couple the integrated circuit with the microstrip transmission line.

26. The method of claim 15, wherein laminating the first semiconductor die and the second semiconductor die together involves establishing physical contact between at least one conductor on the first semiconductor die and at least one conductor on the second semiconductor die to operatively couple the integrated circuit with the microstrip transmission line.

27. The method of claim 15,
   wherein the second semiconductor die includes multiple layers of microstrip transmission lines; and
   wherein adjacent layers are separated by intervening ground planes.

28. The method of claim 27, wherein the intervening ground planes include holes to allow connections between microstrips in different layers.

29. A computer system including an integrated circuit that is operatively coupled with a microstrip transmission line through chip lamination, comprising:
   the integrated circuit;
   a processor within the integrated circuit;
   a memory;
   a first semiconductor die containing the integrated circuit; and
   a second semiconductor die containing the microstrip transmission line, wherein, unlike metal lines in the integrated circuit that have relatively small cross-sections, the microstrip transmission line has a cross-section that is large enough so that signal propagation is governed by inductance and capacitance (LC) instead of resistance and capacitance (RC);
   wherein the first semiconductor die and the second semiconductor die are laminated together so that the integrated circuit on the first semiconductor die is operatively coupled with the microstrip transmission line in the second semiconductor die.

* * * * *